United States Patent
Lu et al.

(10) Patent No.: US 9,607,999 B2
(45) Date of Patent: Mar. 28, 2017

(54) SYSTEM AND METHOD OF UV PROGRAMMING OF NON-VOLATILE SEMICONDUCTOR MEMORY

(71) Applicant: TAIWAN SEMICONDUCTOR MANUFACTURING CO., LTD., Hsin-Chu (TW)

(72) Inventors: Hsiang-Tai Lu, Zhubei (TW); Chih-Hsien Lin, Taichung (JP)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/880,997

(22) Filed: Oct. 12, 2015

(65) Prior Publication Data
US 2016/0035737 A1 Feb. 4, 2016

Related U.S. Application Data

(62) Division of application No. 13/425,451, filed on Mar. 21, 2012, now Pat. No. 9,190,148.

(51) Int. Cl.
| H01L 27/115 | (2006.01) |
|---|---|
| H01L 21/3205 | (2006.01) |
| G11C 29/04 | (2006.01) |
| H01L 21/28 | (2006.01) |
| G11C 16/02 | (2006.01) |
| G11C 16/04 | (2006.01) |
| G11C 16/22 | (2006.01) |
| H01L 21/66 | (2006.01) |

(52) U.S. Cl.
CPC ........ *H01L 27/11521* (2013.01); *G11C 16/02* (2013.01); *G11C 16/0416* (2013.01); *G11C 16/225* (2013.01); *G11C 29/04* (2013.01); *H01L 21/28273* (2013.01); *H01L 21/3205* (2013.01); *H01L 22/14* (2013.01); *H01L 27/11558* (2013.01); *G11C 2029/0403* (2013.01)

(58) Field of Classification Search
CPC .................... H01L 27/115; H01L 27/11521
USPC ........................................................ 257/315
See application file for complete search history.

(56) References Cited

U.S. PATENT DOCUMENTS

| 5,293,328 | A | * | 3/1994 | Amin | H01L 29/7886 257/315 |
|---|---|---|---|---|---|
| 5,298,796 | A | | 3/1994 | Tawel | |
| 5,687,118 | A | * | 11/1997 | Chang | G11C 16/0416 257/315 |
| 2008/0277659 | A1 | * | 11/2008 | Hsu | H01L 22/34 257/48 |
| 2011/0051522 | A1 | * | 3/2011 | Luo | G11C 16/10 365/185.21 |

(Continued)

*Primary Examiner* — David Vu
*Assistant Examiner* — Jonathan Han
(74) *Attorney, Agent, or Firm* — Duane Morris LLP

(57) ABSTRACT

A method of forming a semiconductor memory storage device that includes forming first and second doped regions of a first type in a semiconductor substrate and laterally spaced from one another, forming a gate dielectric extends over the semiconductor substrate between the first and second doped regions, forming a floating gate on the gate dielectric, and forming an ultraviolet (UV) light blocking material vertically disposed above the floating gate such that the floating gate remains electrically charged after the semiconductor memory storage device is exposed to UV light.

20 Claims, 8 Drawing Sheets

(56) References Cited

U.S. PATENT DOCUMENTS

2011/0101348 A1* 5/2011 Tokashiki ............... H01L 22/14
257/48

* cited by examiner

US 9,607,999 B2

SYSTEM AND METHOD OF UV PROGRAMMING OF NON-VOLATILE SEMICONDUCTOR MEMORY

RELATED APPLICATIONS

This is a Divisional Application of and claims priority to U.S. patent application Ser. No. 13/425,451, filed on Mar. 21, 2012, the content of which is incorporated by reference herein in its entirety.

FIELD OF DISCLOSURE

The disclosed system and method relate to integrated circuits. More specifically, the disclosed system and method relate to integrated circuits including non-volatile memories.

BACKGROUND

Non-volatile memories are used in a wide array of applications as it has the ability to retain information in the absence of power and are used as long-term persistent storage. Examples of non-volatile memories include, but are not limited to, read only memories ("ROMs") such as programmable ROMs ("PROMs"), erasable PROMs ("EPROMs"), and electrically erasable PROMs ("EEPROMs"). Another example of a non-volatile memory is ultraviolet-erase ("UV-erase") PROMs. The programming of some non-volatile memories requires external circuits for writing data, which is performed after the manufacturing process of the integrated circuit chip has been completed.

DETAILED DESCRIPTION

This description of the exemplary embodiments is intended to be read in connection with the accompanying drawings, which are to be considered part of the entire written description.

The improved non-volatile semiconductor memories and methods described herein advantageously may be programmed during the manufacturing process prior to the packaging of an integrated circuit chip. Programming of the non-volatile memories during the manufacturing process enables the resultant chips on which the non-volatile memories are formed to have a reduced pin count, which results in a smaller chip size, as post-manufacturing programming can be eliminated.

Figure 1:
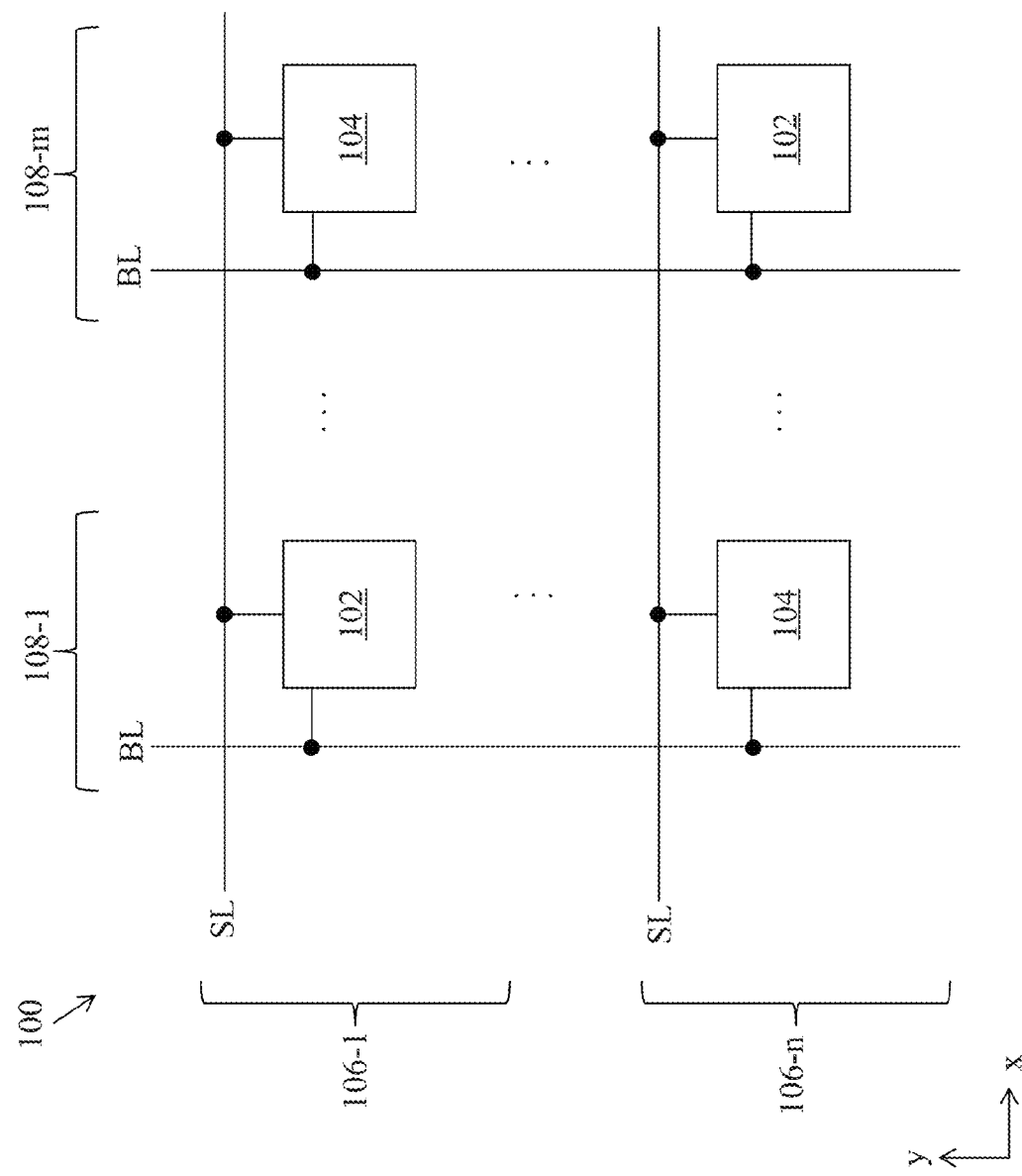
FIG. 1 is a high level block diagram of one example of an improved non-volatile semiconductor memory.

FIG. 1 illustrates one example of an improved non-volatile memory array 100 including a plurality of programmed zero memory bit cells 102 and a plurality of programmed one memory bit cells 104. Bit cells 102, 104 are arranged in a number, n, of rows 106 and a number, m, of columns 108. In some embodiments, improved non-volatile array 100 is an ultraviolet-erasable ("UV-erasable") memory array. Each bit cell 102, 104 is coupled to a source line, SL, that horizontally extends across the memory array (i.e., in an x-direction) and a bit line ("BL") that vertically extends across the memory array (i.e., in a y-direction).

Figure 2:
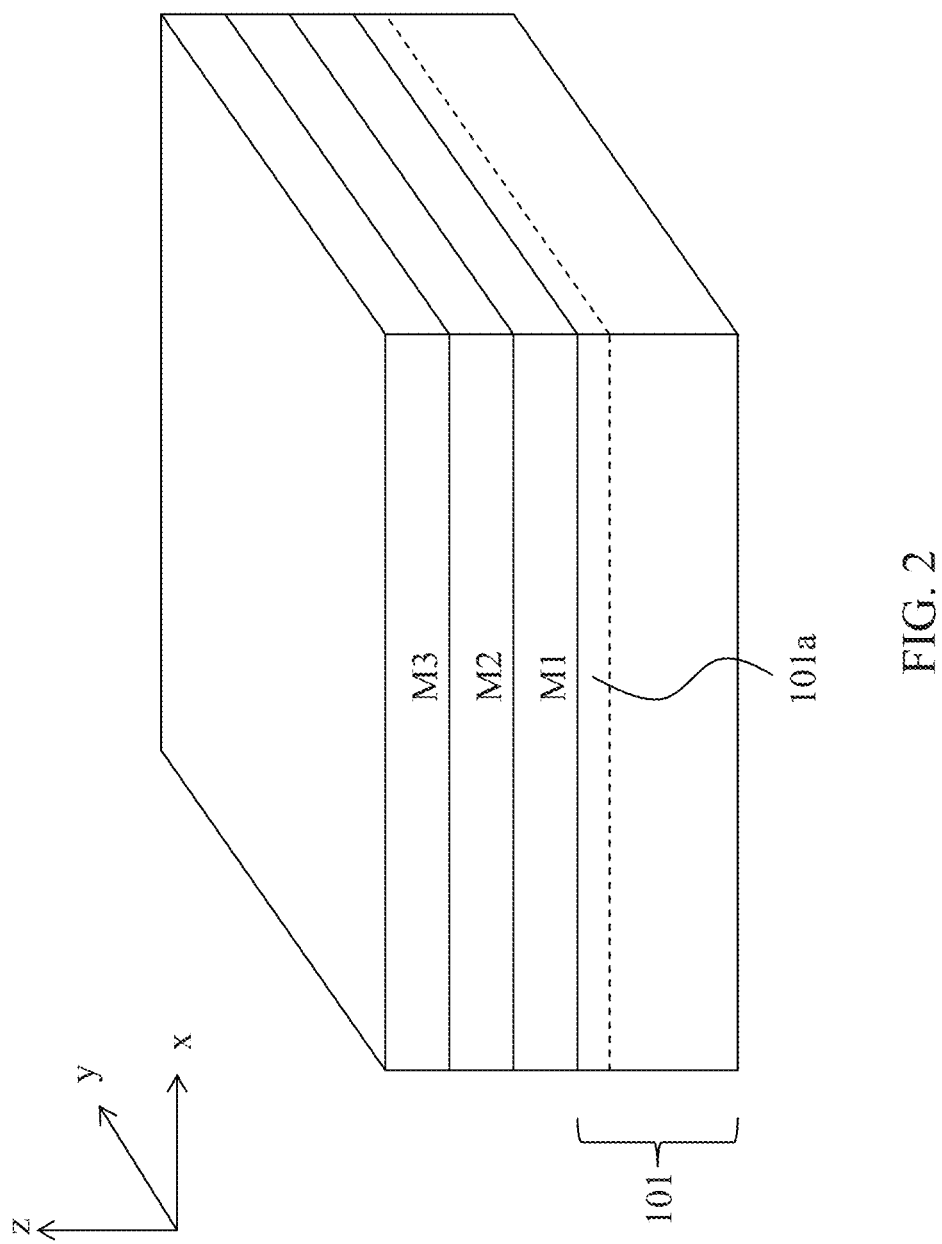
FIG. 2 is an isometric view of the layers of a semiconductor wafer in which the non-volatile semiconductor memory illustrated in FIG. 1 is formed.

The non-volatile memory array may be formed in a semiconductor substrate 101 having one or more doped active regions 101a as illustrated in FIG. 2. For example, one or more doped wells (e.g., n-wells and/or p-wells) may be formed in doped regions 101a. A plurality of conductive layers, M1-M3 are formed above substrate 101 in a vertical or z-direction. Each conductive layer M1-M3 defines a plane in the x- and y-direction and may be separated from each other and from substrate 101 by one or more dielectric layers (not shown). As will be understood by one skilled in the art, vias extend in the vertical direction, i.e., z-direction, to provide interconnects between conductive layers M1-M3 and semiconductor substrate 101. Fewer or more than three conductive layers may be formed over semiconductor substrate 101.

Figure 3A:
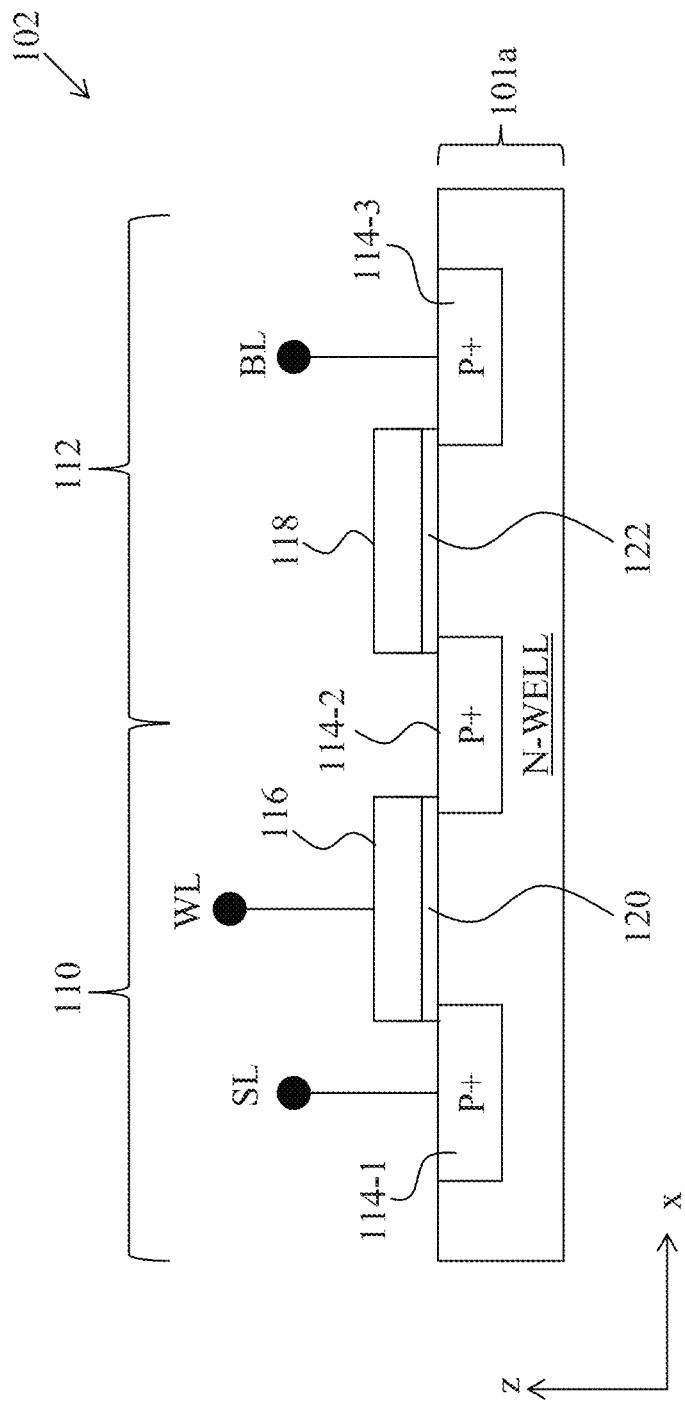
FIG. 3A is a cross-sectional view of a bit cell configured to store a logic zero in accordance with the non-volatile semiconductor memory illustrated in FIG. 1.
Figure 3B:
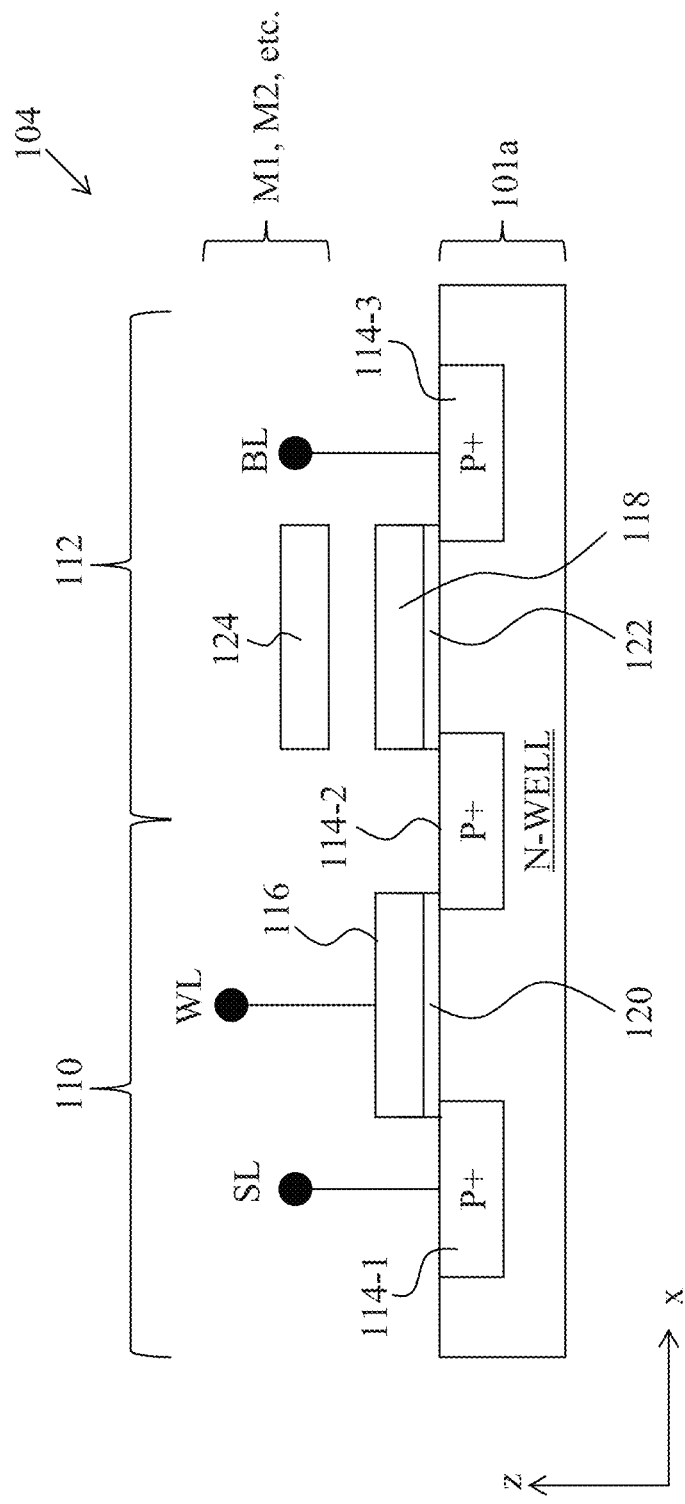
FIG. 3B is a cross-sectional view of a bit cell configured to store a logic one in accordance with the non-volatile semiconductor memory illustrated in FIG. 1.

FIGS. 3A and 3B respectively illustrate cross-sectional views of a stored zero bit cell 102 and a stored one bit cell 104. Referring first to FIG. 3A, bit cell 102 includes a first transistor 110 coupled to a storage transistor 112. Transistors 110 and 112 are formed in an n-well in which a plurality of doped P+ regions 114-1, 114-2, and 114-3 ("doped P+ regions 114). Although doped regions 114 are described as P+ regions formed in an n-well, one of ordinary skill in the art will understand that doped regions 114 may be N+ regions formed in a p-well. Gates 116 and 118 are formed over respective gate oxide regions 120, 122, which are disposed over the n-well between adjacent P+ regions 114 forming a channel. P+ region 114-1 is coupled SL. Gate 116 of transistor 110 is coupled to receive a control signal for turning on transistor 110, which is formed by P+ regions 114-1, 114-2, gate 116, and oxide region 120. P+ region 114-2 also forms a part of transistor 112, which includes floating gate 118, oxide 122, and P+ region 114-3. P+ region 114-3 is coupled to a bit line, BL.

Referring now to FIG. 3B, bit cell 104 includes an n-well formed in the doped region 101a of a semiconductor substrate 101. Pass transistor 110 includes doped regions 114-1 and 114-2, gate 116, and gate oxide 120. Doped region 114-1 is coupled to the SL line, and gate 116 is coupled to the word line, WL, which controls the turning on and off of transistor 110.

Storage transistor 112 includes doped region 114-2, which is coupled to transistor 110, and doped region 114-3. Floating gate 118 is disposed over oxide 122, which is formed between doped regions 114-2 and 114-3. Doped region 114-3 is coupled to a bit line, BL. An ultraviolet-resistant or blocking material 124 is disposed in one or more of the conductive layers, e.g., M1, M2, etc., disposed over doped region 101a of semiconductor substrate 101. Although described as being disposed in a conductive layer such as M1, M2, etc., one of ordinary skill in the art will understand that material 124 may be disposed in a via layer or in a conductive layer between conductive layers. In some embodiments, material 124 is the same material used to form interconnect lines and vias including, but not limited to, metals, such as copper or aluminum.

Material 124 is vertically positioned (i.e., in the z-direction as shown in FIG. 3B) over floating gate 118 and has a size in the x- and y-directions that covers floating gate 118. In some embodiments, material 124 has a size in the x- and y-directions that is greater than a size of floating gate 118. In some embodiments, material 124 covers the entire cell 104 including pass transistor 110. Material 124 prevents UV energy from discharging floating gate 118 when the non-volatile storage device 100 is exposed to a UV source.

Figure 4:
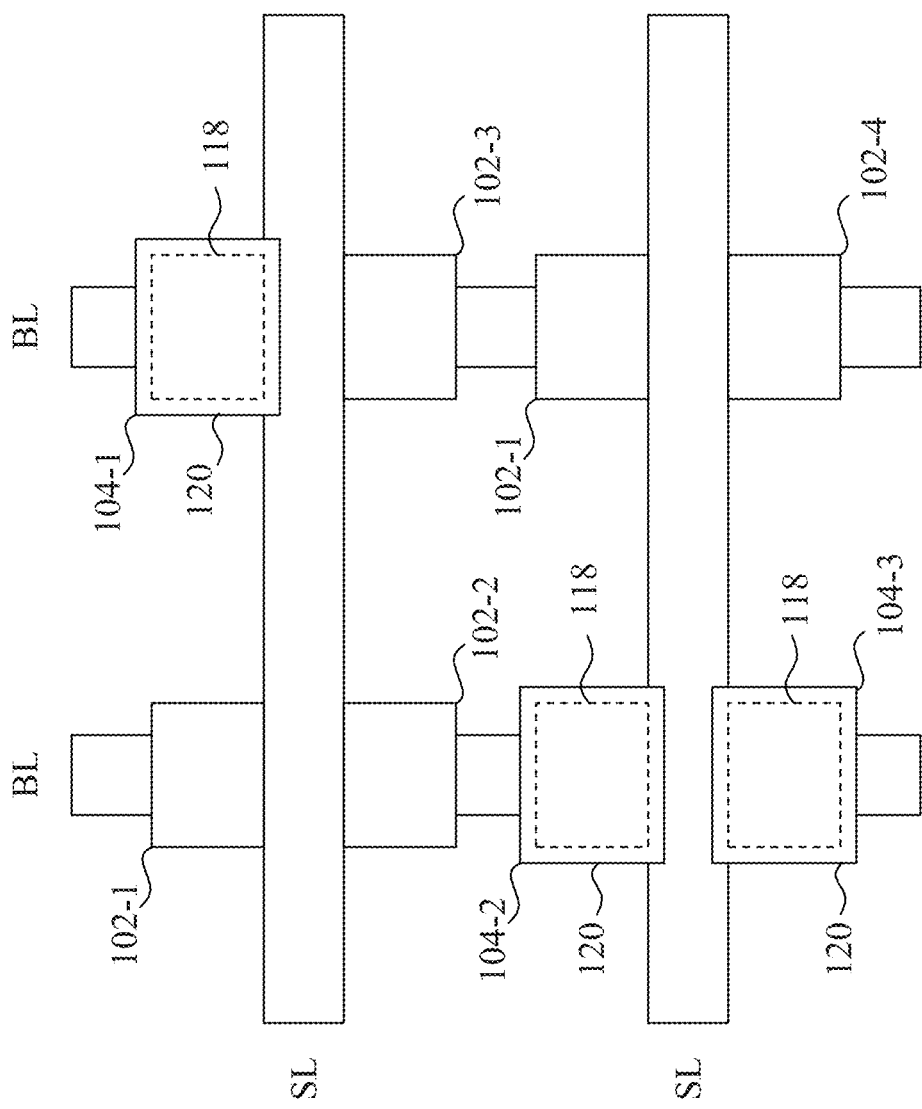
FIG. 4 is a plan view of a plurality of bit cells configured to store logic zeroes or logic ones in accordance with the non-volatile memory illustrated in FIG. 1.
Figure 5:
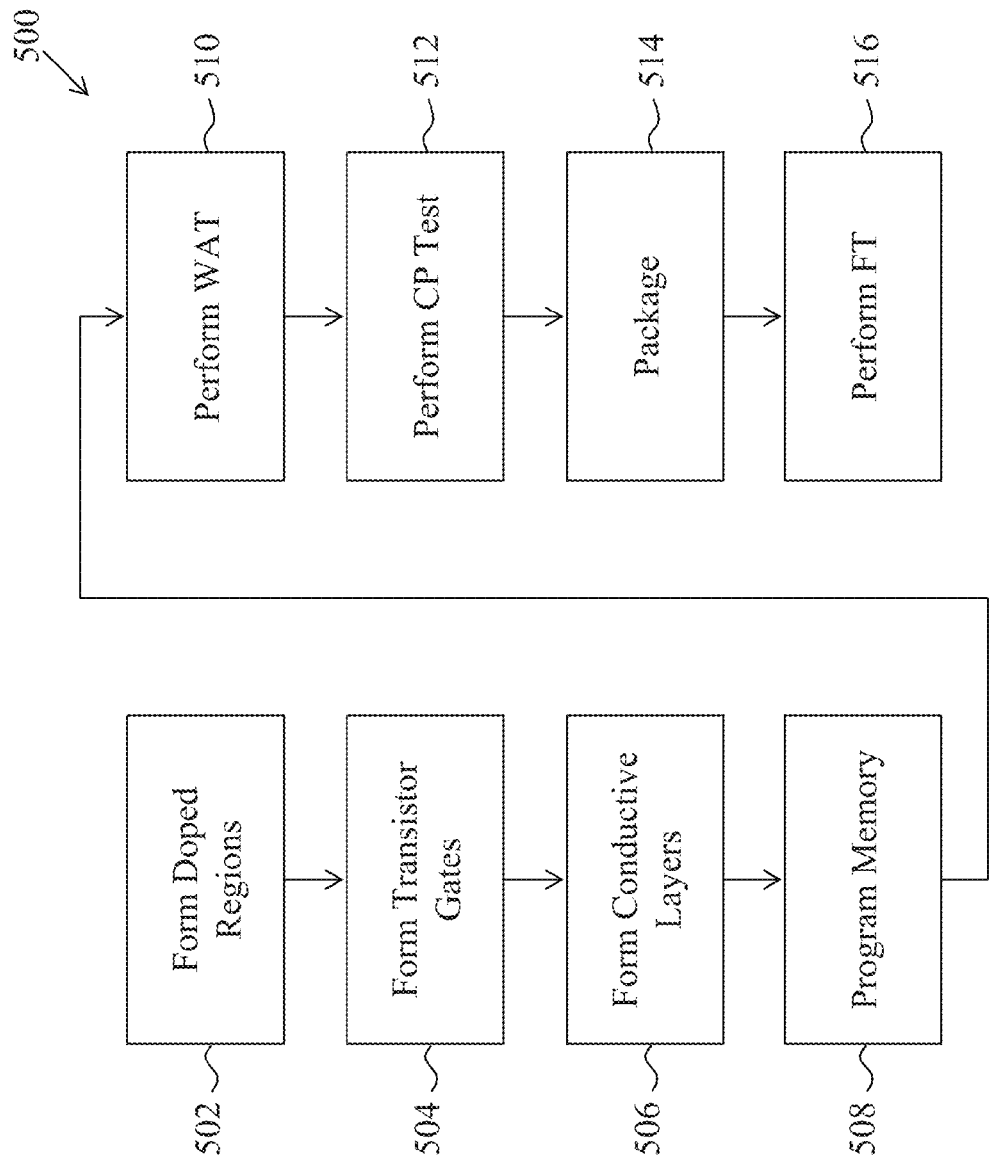
FIG. 5 is a flow diagram of one example of a method of fabricating a non-volatile semiconductor memory in accordance with the non-volatile memory illustrated in FIG. 1.

For example, FIG. 4 illustrates a plan view of a plurality of store zero bit cells 102 coupled to bit lines, BL, and to select lines, SL, as well as a plurality of store one bit cells 104, which are also coupled to bit lines, BL, and to select lines, SL. Each of the store one bit cells 104 is at least partially covered by material 124 formed in one of the layers above doped region 101a of semiconductor substrate 101. As can be seen in FIG. 4, material 124 may cover floating gate 118 of storage transistor 112.

One example of a method 500 of fabricating an improved non-volatile memory in accordance with the non-volatile memory 100 illustrated in FIGS. 1-4. At block 502, semiconductor wafer 101 is doped to create doped region 101a. As will be understood by one of ordinary skill in the art, the doping of a semiconductor wafer includes photoresist deposition and patterning steps as well as ion implantation to create n-wells, p-wells, P+ regions, and N+ regions in the semiconductor substrate 101.

At block 504, the gates 116, 118 of transistors 110, 112 are formed. In some embodiments, the formation of gates 116, 118 includes oxidizing the silicon over a channel region to form silicon dioxide, which forms oxide layers 120 and 122. A conductive material, such as aluminum, doped silicon, polycrystalline silicon, a refractory metal (e.g., tungsten), a silicide (TiSi, MoSi, TaSi, WSi), or combinations thereof, is deposited over the oxide 120, 122 to form gates 116, 118.

At block 506, conductive layers M1, M2, etc. are formed. The formation of the conductive layers includes dielectric deposition and patterning, deposition of conductive layers, and the creation of vias through the dielectric layers to connect the different conductive layers. The formation of the conductive layers also includes the formation of a UV-resistant material 124 in one of the conductive layers. As described above, material 124 may be vertically disposed above (i.e., in the z-direction) the floating gate 118 of each of the transistors 112 of a store one bit cell 104. In some embodiments, material 124 has a size in the x- and y-directions that is greater than a size of floating gate 118. In some embodiments, material 124 covers the entire cell 104 including pass transistor 110.

At block 508, the non-volatile memory 100 is programmed. As will be understood by an ordinarily skilled person, floating gates 118 are charged by peripheral circuitry (not shown), such as a row decoder, control circuitry a voltage generator, and input/output (I/O) circuitry, such that each floating gate of the non-volatile array 100 is charged to a logic one. The logic zeroes are programmed by exposing the non-volatile array 100 to a UV source. In some embodiments, the UV source generates wavelengths 254 nm with a power of 31 mW/cm$^2$, which is directed at the floating gates 118 for a period of 30 minutes. One of ordinary skill in the art will understand that the UV exposure conditions (e.g., wavelength, power, and duration of exposure) may be varied. In some embodiments, the UV exposure lasts for two hours. Examples of UV sources include, but are not limited to, the Spectroline PC-4420A and PC-8820B available from Spectronics Corporation of Westbury, N.Y.

Exposing the non-volatile semiconductor memory array 100 causes the charge stored on floating gates 118 of store zero bit cells 102 to discharge. Material 124 vertically positioned above floating gates 118 of store one bit cells 104 absorbs the UV energy emitted by UV source such that the UV energy does not reach floating gate 118 thereby prevent the charge stored on floating gate 18 from being discharged.

At block 510, a wafer acceptance test (WAT) is performed. As will be understood by one of ordinary skill in the art, performing a WAT includes subjecting a semiconductor wafer to various tests at different sites on the semiconductor wafer. The WAT may be performed using a system including an I/O device, a processor, and a storage device. The I/O device provides an interface between the wafer and the processor and is used to transmit and receive signals from both. The results of the WAT may be stored in the storage device, such as a non-transient machine readable storage medium.

At block 512, semiconductor wafers on which a non-volatile memory array 100 are disposed and have passed the WAT undergo a circuit probe (CP) test. The CP test is performed using a wafer prober that performs electrical testing of the wafer through a probe card held in place while the wafer is disposed on a chuck. The data are written to and read from the test chip and the CP test device compares the data input to the data output from the test chip to determine if the test chip includes errors.

At block 514, the semiconductor wafers that pass the CP test are diced and the chips are packaged. In some embodiments, the packaging of integrated circuit chips includes at least one of wire bonding, flip chip bonding, and encapsulation.

At block 516, a final test (FT) is performed on the packaged integrated circuit. In some embodiments, the FT test of the package includes writing data to and reading data from the non-volatile semiconductor memory 100. The FT test is performed to identify if the integrated circuit was damaged during the packaging process.

Figure 6A:
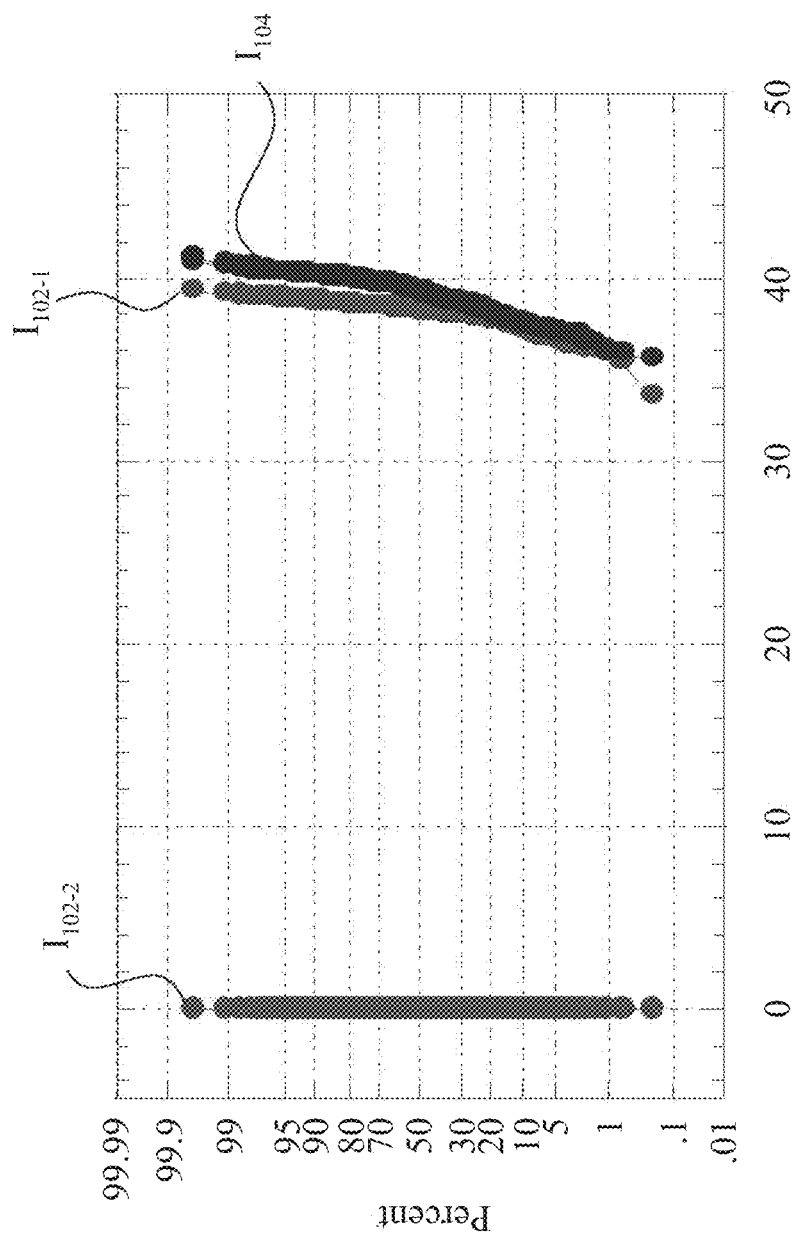
FIG. 6A is a graph illustrates the current through store one and store zero bit cells before and after exposure to UV energy.

FIG. 6A is a graph illustrating the pre-programming current through a store one bit cell 104, $I_{104}$, and through a store zero bit cell 102, $I_{102-1}$, and the post-programming current through the store bit cell 104, $I_{104}$, and through the store zero bit cell 102, $I_{102-2}$. The programming of the bit cells 102, 104 included exposing the bit cells 102, 104 to a wavelength of 254 nm having a power of 31 mW/cm$^2$ for a period of two hours. As shown in FIG. 6A, the store zero bit cell 102 is fully discharged ($I_{102-2}$=0 mA) after programming while the store one bit cell 104 remains charged.

Figure 6B:
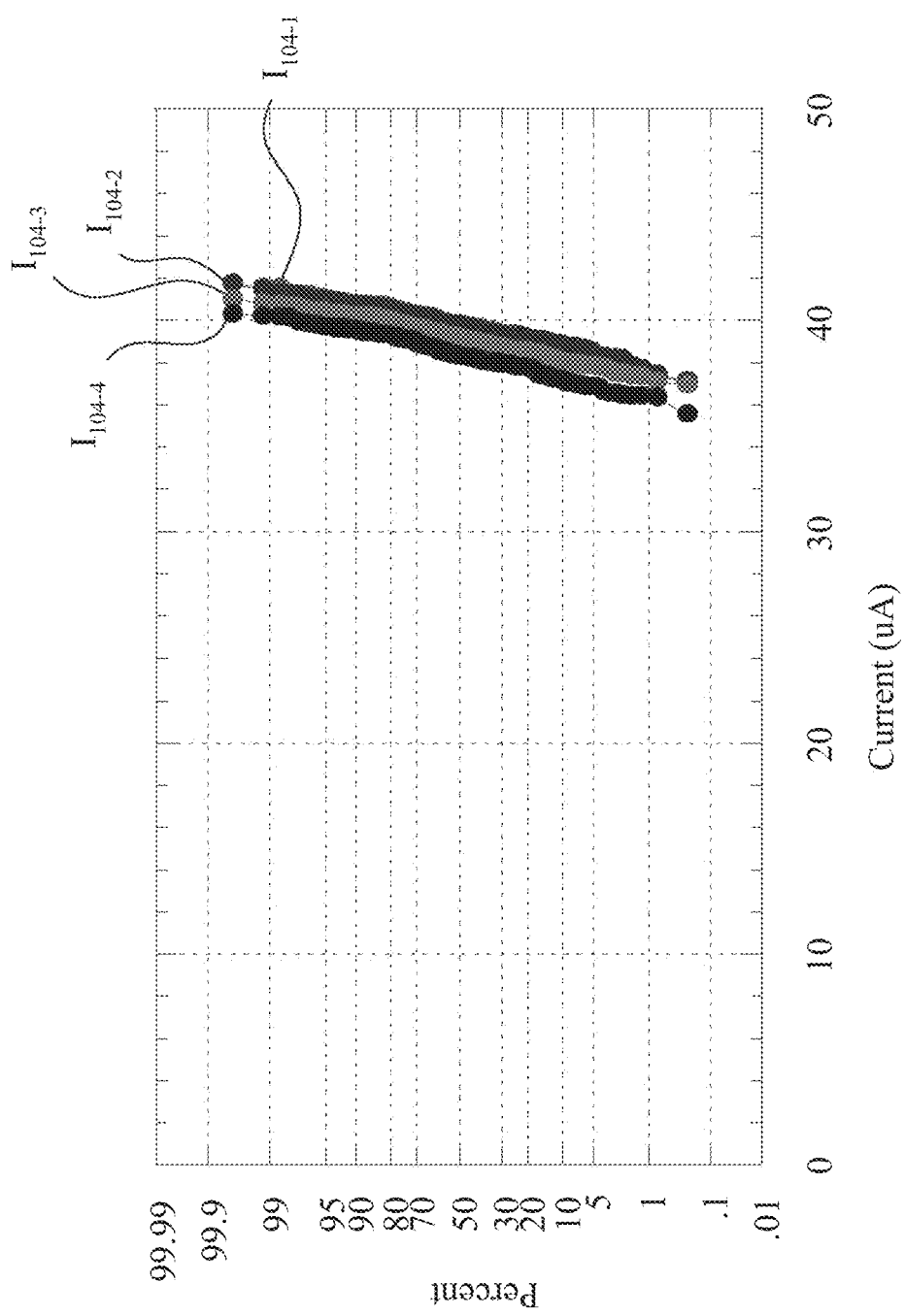
FIG. 6B is a graph illustrating the current through a store one bit cell at various times of being exposed to UV energy.

FIG. 6B illustrates the current through store one bit cell 104 at various times during programming. For example, FIG. 6B illustrates the current through a store one bit cell 104 prior to programming and at various times during programming. In particular, line $I_{104-1}$ corresponds to the current through the bit cell 104 prior to programming (i.e., t=0 hours), line $I_{104-2}$ corresponds to the current at t=5 minutes, line $I_{104-3}$ corresponds to the current at t=1 hour, and line $I_{104-4}$ corresponds to the current at t=2 hours. As is best seen in FIG. 6B, the duration of the programming time has little effect on the current through the programmed one bit cells due to the existence of material 124.

The improved non-volatile semiconductor memories described above are programmable during the manufacturing process and prior to packaging of an integrated circuit chip. Programming of the non-volatile memories during the manufacturing process enables the resultant chips on which the non-volatile memories are formed to have a reduced pin count, which results in a smaller chip size, as post-manufacturing programming can be eliminated.

In some embodiments, a semiconductor memory storage device includes first and second doped regions of a first type disposed in a semiconductor substrate. The first and second doped regions of the first type being laterally spaced from one another. A gate dielectric extends over the semiconductor substrate between the first and second doped regions, and a floating gate is disposed on the gate dielectric. An ultraviolet (UV) light blocking material is vertically disposed above the floating gate and has a size that covers the floating gate such that the floating gate remains electrically charged after the semiconductor memory storage device is exposed to UV light.

In some embodiments, a method includes forming a semiconductor storage device in a semiconductor substrate. The semiconductor substrate is doped with a dopant of a first type to create first and second doped regions of the first doping type. The first and second doped regions of the first type are laterally spaced from one another in the semiconductor substrate. A floating gate is disposed over a dielectric that extends between the first and second doped regions of the first doping type. A plurality of dielectric layers and conductive layers are disposed over the floating gate. The semiconductor storage device is programmed and exposed to an ultraviolet (UV) energy source. At least one of the dielectric and conductive layers includes an ultraviolet (UV) light blocking material vertically disposed above the floating gate. The UV light blocking material has a size that covers the floating gate such that the floating gate remains electrically charged after the semiconductor storage device is exposed to the UV energy.

In some embodiments, a semiconductor memory includes a first plurality of storage devices of a first type and a second plurality of storage devices of a second type. Each of the plurality of storage devices of the second type includes a first doped region of a first doping type disposed in a semiconductor substrate and defining a source. A second doped region of the first doping type is disposed in the semiconductor substrate defining a drain. The second doped region is laterally spaced from the first doped region. A first gate dielectric extends over the semiconductor substrate between the first and second doped regions, and a first floating gate is disposed on the first gate dielectric. An ultraviolet (UV) light blocking material is vertically disposed above the floating gate. The UV light blocking material has a size that covers the floating gate such that the floating gate remains electrically charged after the storage device of the second type is exposed to UV light.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

The invention claimed is:

1. A method of forming a semiconductor storage device in a semiconductor substrate, comprising:
    doping the semiconductor substrate with a dopant of a first type to create first and second doped regions of the first doping type, the first and second doped regions of the first type laterally spaced from one another in the semiconductor substrate;
    disposing a floating gate over a dielectric that extends between the first and second doped regions of the first doping type;
    forming a plurality of dielectric layers and conductive layers over the floating gate;
    programming the semiconductor storage device with a logical state; and
    exposing the semiconductor storage device to an ultraviolet (UV) energy source,
    wherein the at least one of the dielectric and conductive layers includes an ultraviolet (UV) light blocking material vertically disposed above the floating gate, the UV light blocking material having a size that covers the floating gate such that the semiconductor storage device remains at the programmed logical state after the semiconductor storage device is exposed to the UV energy.

2. The method of claim 1, further comprising:
    performing a first test after the semiconductor storage device has been formed but prior to packaging the semiconductor storage device as an integrated circuit; and
performing a second test after the semiconductor storage device has been packaged.

3. The method of claim 2, further comprising packaging the semiconductor storage device in the integrated circuit.

4. The method of claim 2, further comprising performing a third test prior to packaging the semiconductor storage device in the integrated circuit.

5. The method of claim 4, wherein the first test includes a circuit probe test of data stored in the semiconductor storage device, and the third test includes a wafer acceptance test.

6. The method of claim 1, wherein forming the semiconductor device includes doping the semiconductor substrate with a dopant of a second type to create a well in which the first and second doped regions of the first type are disposed.

7. A method of forming a semiconductor memory storage device in a semiconductor substrate, comprising:
    forming a first doped region of a first doping type in the semiconductor substrate defining a source;
    forming a second doped region of the first doping type in the semiconductor substrate defining a drain, the second doped region laterally spaced from the first doped region;
    forming a gate dielectric over the semiconductor substrate between the first and second doped regions;
    forming a floating gate on the gate dielectric;
    programming the semiconductor memory storage device with a logical state; and
    disposing an ultraviolet (UV) light blocking material vertically above the floating gate, the UV light blocking material having a size that covers the floating gate such that the semiconductor storage device remains at the programmed logical state after the semiconductor memory storage device is exposed to UV light,
    wherein one of the first doped region of the first doping type and the second doped region of the first doping type is coupled to a bit line.

8. The method of claim 7, wherein disposing the UV light blocking material comprises disposing the UV light blocking material in a conductive layer disposed over the floating gate.

9. The method of claim 7, wherein the UV blocking material includes at least one of copper, tungsten, and aluminum.

10. The method of claim 1, wherein the first and second doped regions of the first doping type are formed in a well of a second doping type that is disposed in the semiconductor substrate.

11. The method of claim 10, wherein the first doping type is a p-type and the second doping type is an n-type.

12. The method of claim 10, wherein the first doping type is an n-type and the second doping type is a p-type.

13. The method of claim 7, wherein the first doped region of the first doping type, the second doped region of the first doping type, the gate dielectric, and the floating gate form a first transistor, the method further comprising:
    forming a third doped region of the first doping type laterally spaced from the first doped region of the first doping type and the second doped region of the first doping type; and
    coupling one of the source or the drain to a second source or a second drain of a second transistor having a second gate that is laterally spaced from the floating gate and is disposed between the third doped region of the first doping type and one of the first and second doped regions of the first doping type,
    wherein the second gate is coupled to a word line, and
    wherein the third doped region of the first doping type is coupled to a select line.

14. A method of forming a semiconductor memory storage device, comprising:
    forming a first plurality of storage devices of a first type; and
    forming a second plurality of storage devices of a second type, wherein forming each of the plurality of storage devices of the second type, comprises:
        forming a first doped region of a first doping type in a semiconductor substrate defining a source;
        forming a second doped region of the first doping type in the semiconductor substrate defining a drain, the second doped region laterally spaced from the first doped region;
        forming a first gate dielectric extending over the semiconductor substrate between the first and second doped regions;
        forming a first floating gate on the first gate dielectric;
        programming at least one of the storage device of the second type with a logical state; and
        disposing an ultraviolet (UV) light blocking material vertically above the floating gate, the UV light blocking material having a size that covers the floating gate such that the at least one storage device of the second type remains at the programmed logical state after the at least one storage device of the second type is exposed to UV light,
    wherein one of the first doped region of the first doping type and the second doped region of the first doping type is coupled to a bit line.

15. The method of claim 14, wherein the first and second doped regions of the first doping type are disposed in a well of a second doping type.

16. The method of claim 15, wherein the first doping type is a p-type and the second doping type is an n-type.

17. The method of claim 15, wherein the first doping type is an n-type and the second doping type is a p-type.

18. The method of claim 14, wherein forming the storage devices of the first type comprises:
    forming a third doped region of the first doping type in the semiconductor substrate defining a source;
    forming a fourth doping region of the first doping type in the semiconductor substrate defining a drain, the fourth doped region laterally spaced from the third doped region;
    forming a second gate dielectric extending over the semiconductor substrate between the third and fourth doped region; and
    forming a second floating gate on the second dielectric, the second floating gate configured to be discharged in response to the storage device of the first type being exposed to UV light.

19. The method of claim 18, wherein the third and fourth doped regions of the first doping type are disposed in a well of a second doping type.

20. The method of claim 14, wherein forming the UV light blocking material comprises forming the UV light blocking material in a conductive layer disposed over the first floating gate.

* * * * *